United States Patent
Morrison et al.

(10) Patent No.: US 12,334,693 B2
(45) Date of Patent: Jun. 17, 2025

(54) RECONFIGURABLE CONNECTOR SYSTEM

(71) Applicant: GM GLOBAL TECHNOLOGY OPERATIONS LLC, Detroit, MI (US)

(72) Inventors: James Morrison, Sebringville (CA); Lyall K. Winger, Waterloo (CA); Agustin Velazquez Mejia, Macomb, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 435 days.

(21) Appl. No.: 18/072,897

(22) Filed: Dec. 1, 2022

(65) Prior Publication Data

US 2024/0186757 A1   Jun. 6, 2024

(51) Int. Cl.
| | |
|---|---|
| *H01R 31/06* | (2006.01) |
| *H01R 12/71* | (2011.01) |
| *H01R 12/75* | (2011.01) |
| *H05K 1/02* | (2006.01) |
| *H05K 1/11* | (2006.01) |
| *H05K 1/14* | (2006.01) |

(52) U.S. Cl.
CPC ............ *H01R 31/06* (2013.01); *H01R 12/71* (2013.01); *H01R 12/75* (2013.01); *H05K 1/029* (2013.01); *H05K 1/11* (2013.01); *H05K 1/14* (2013.01); *H05K 2201/10181* (2013.01)

(58) Field of Classification Search
CPC ...... H01R 31/06; H01R 31/02; H01R 31/005; H01R 31/065; H01R 31/08; H01R 31/085; H01R 12/71; H01R 12/75; H05K 1/029; H05K 1/11; H05K 1/14; H05K 2201/10181

See application file for complete search history.

(56) References Cited

U.S. PATENT DOCUMENTS

| | | | | |
|---|---|---|---|---|
| 5,788,529 A | * | 8/1998 | Borzi | H01R 9/2458 29/830 |
| 6,077,102 A | * | 6/2000 | Borzi | H01R 9/2458 439/364 |
| 6,561,822 B2 | * | 5/2003 | Depp | H05K 7/026 439/76.2 |
| 6,679,708 B1 | * | 1/2004 | Depp | H05K 7/026 361/752 |
| 7,074,053 B2 | * | 7/2006 | Kawakita | H01R 13/6658 174/541 |

(Continued)

*Primary Examiner* — Harshad C Patel
(74) *Attorney, Agent, or Firm* — Quinn IP Law

(57) ABSTRACT

A reconfigurable connector system for distributing power between an input power source and a cable harness connector having M cable harness terminals includes an energy center module (ECM) and a connecting adapter. The ECM has a module housing, a PCB having more than M pin holes, a plurality of e-fuses connected with the pin holes, a controller connected with the e-fuses, and an input connector connected to the controller and/or the e-fuses. The connecting adapter has a body with first and second sides and M bridging adapters within the body. Each bridging adapter includes a first connection point accessible from the first side and configured to be directly connectable with a cable harness terminal, one or more second connection points accessible from the second side and configured to be connectable with a pin hole, and a busbar connecting the first connection point with the one or more second connection points.

20 Claims, 6 Drawing Sheets

(56) References Cited

U.S. PATENT DOCUMENTS

| | | | | |
|---|---|---|---|---|
| 7,252,551 B2* | 8/2007 | Ueno | .................. | H01R 4/2433 |
| | | | | 439/620.21 |
| 7,311,559 B1* | 12/2007 | Schlotterbeck | ........ | G01R 31/50 |
| | | | | 439/700 |
| 7,549,872 B2* | 6/2009 | Akahori | ............... | H01R 13/514 |
| | | | | 439/949 |
| 7,699,624 B2* | 4/2010 | Muramatsu | ............ | B60K 35/60 |
| | | | | 439/541.5 |
| 8,282,403 B2* | 10/2012 | Sawai | .................. | H01R 12/714 |
| | | | | 439/79 |
| 8,419,443 B2* | 4/2013 | Kamo | .................. | H01R 25/165 |
| | | | | 439/76.1 |
| 8,961,198 B2* | 2/2015 | Ferran Palau | ......... | H01R 9/226 |
| | | | | 439/949 |
| 9,004,926 B2* | 4/2015 | Ozawa | ............... | H01H 85/2035 |
| | | | | 439/76.2 |
| 9,227,581 B1* | 1/2016 | Gauthier | ............... | G07C 5/0808 |
| 11,349,475 B1* | 5/2022 | Winger | .................. | H03K 17/56 |
| 12,119,596 B2* | 10/2024 | Su | ........................ | H01R 25/162 |
| 2009/0163085 A1* | 6/2009 | Makino | .................. | H01R 43/20 |
| | | | | 439/701 |
| 2010/0317241 A1* | 12/2010 | Sugiura | ............... | H01R 9/2466 |
| | | | | 439/733.1 |
| 2017/0093102 A1* | 3/2017 | Huang | ................. | H01R 12/721 |
| 2020/0156570 A1* | 5/2020 | Bang | ..................... | H02H 7/268 |
| 2020/0389012 A1* | 12/2020 | Nakamura | ............. | H02H 7/226 |

\* cited by examiner

RECONFIGURABLE CONNECTOR SYSTEM

This disclosure relates to reconfigurable connector systems having electronic fuses for distributing power between an input power source and a cable harness connector.

In automotive vehicles, machine control panels and many other applications, it is often useful to bundle a collection of wires or cables into a cable harness, with the wires or cables being terminated to a connector which may be plugged into a control housing or other device. These wires or cables may be provided in a variety of different sizes or gauges for carrying a variety of different currents. In turn, each of these wires may have its own current-carrying limit, thus requiring a variety of different fuses and overload protection levels.

SUMMARY

According to one embodiment, a reconfigurable connector system is provided for distributing power between an input power source and a cable harness connector having a first number M of cable harness terminals configured to carry a plurality of different currents. The reconfigurable connector system includes an energy center module and a connecting adapter. The energy center module has a module housing, a printed circuit board located within the module housing and having more than M pin holes therein, a plurality of electronic fuses located within the module housing and operatively connected with the pin holes, a controller located within the module housing and operatively connected with the plurality of electronic fuses via control circuitry, and an input connector located within the module housing for receiving power from the input power source and operatively connected to one or more of the controller and the plurality of electronic fuses via power circuitry, wherein the controller is configured for running control software for controlling the plurality of electronic fuses. The connecting adapter has an electrically insulative body with opposed first and second sides and M electrically conductive bridging adapters within the body. Each bridging adapter includes: a respective first connection point accessible from the first side of the body and configured to be directly connectable with a respective one of the cable harness terminals; one or more respective second connection points accessible from the second side of the body and configured to be directly or indirectly connectable with a respective one or more of the pin holes; and a respective busbar connecting the respective first connection point with the one or more respective second connection points.

The controller may include a memory configured for storing the control software and processing circuitry configured for retrieving the control software from the memory and executing the control software, and the reconfigurable connector system may further include the control software.

The controlling of the plurality of electronic fuses may include assigning one or more of the plurality of electronic fuses to one or more clusters of the electronic fuses, wherein each cluster corresponds with a respective one of the bridging adapters.

The plurality of electronic fuses and the controller may be located on the printed circuit board, and each electronic fuse may be operatively connected with a respective one of the pin holes. The M bridging adapters collectively may include M first connection points and a second number N of the second connection points, wherein N≥M.

The respective first connection point, the respective one or more second connection points and the respective busbar for each bridging adapter may be oriented either (i) within the same plane as each other, or (ii) with the respective first connection point disposed within a first plane and with at least one of the respective one or more second connection points disposed within a second plane that is different from the first plane.

The cable harness connector may have a module-facing side and an opposed cable harness-facing side, wherein each of the cable harness terminals is accessible to the first connection points from the module-facing side and is configured for connection with a respective wire from the cable harness-facing side.

Each of the first and second connection points may be a male terminal, each of the cable harness terminals may be a female terminal, each of the second connection points may be configured for direct connection with a respective one of the pin holes, and the connecting adapter may be configured for being secured at least partially within the module housing. Alternatively, each of the first and second connection points may be a male terminal, each of the cable harness terminals may be a female terminal, each of the second connection points may be configured for direct connection with a respective one of the pin holes, and the connecting adapter may be configured for engagement with the module housing for effecting insertion of the second connection points into the pin holes.

The printed circuit board may include an array of pin connectors, wherein each pin connector has a respective first pin end inserted into a respective one of the pin holes and having a male polarity and a second pin end extending outward from the printed circuit board and having a male or female polarity.

In one configuration, each of the first connection points may be a male terminal, each of the second connection points may be a terminal having a polarity opposite the polarity of the second pin ends, each of the cable harness terminals may be a female terminal, each of the second connection points may be configured for direct connection with a respective one of the second pin ends, and the connecting adapter may be configured for engagement with the module housing for effecting press-fit connection of the second connection points with the second pin ends.

In another configuration, the reconfigurable connector system may further include the cable harness connector, wherein each of the first connection points is a male terminal, each of the second connection points is a terminal having a polarity opposite the polarity of the second pin ends, each of the cable harness terminals is a female terminal, each of the second connection points is configured for direct connection with a respective one of the second pin ends, and the connecting adapter is configured for being secured at least partially within the cable harness connector and for engagement with the module housing for effecting press-fit connection of the second connection points with the second pin ends.

In yet another configuration, the reconfigurable connector system may further include the cable harness connector and a respective wire for each bridging adapter, wherein each of the first connection points is a terminal configured for direct attachment with the respective wire, each of the second connection points is a terminal having a polarity opposite the polarity of the second pin ends, each of the cable harness terminals is a crimp or a soldering, each of the second connection points is configured for direct connection with a respective one of the second pin ends, and the connecting adapter is configured for being secured at least partially within the cable harness connector and for engagement with the module housing for effecting press-fit connection of the second connection points with the second pin ends.

According to another embodiment, a reconfigurable connector system is provided for distributing power between an input power source and a cable harness connector having a first number M of cable harness terminals configured to carry a plurality of different currents. In this embodiment, the reconfigurable connector system includes: (i) an energy center module having a module housing, a printed circuit board located within the module housing and having more than M pin holes therein, a plurality of electronic fuses located within the module housing and operatively connected with the pin holes, a controller located within the module housing and operatively connected with the plurality of electronic fuses via control circuitry, and an input connector located within the module housing for receiving power from the input power source and operatively connected to one or more of the controller and the plurality of electronic fuses via power circuitry, wherein the controller is configured for running control software for controlling the plurality of electronic fuses; (ii) and a connecting adapter having an electrically insulative body with opposed first and second sides and M electrically conductive bridging adapters within the body. Each bridging adapter includes: (a) a respective first connection point accessible from the first side of the body and configured to be directly connectable with a respective one of the cable harness terminals; (b) one or more respective second connection points accessible from the second side of the body and configured to be directly or indirectly connectable with a respective one or more of the pin holes; and (c) a respective busbar connecting the respective first connection point with the one or more respective second connection points. In this embodiment, each of the first and second connection points is a male terminal, each of the cable harness terminals is a female terminal, each of the second connection points is configured for direct connection with a respective one of the pin holes, and the connecting adapter is configured for being secured at least partially within the module housing or for engagement with the module housing for effecting insertion of the second connection points into the pin holes.

According to yet another embodiment, a reconfigurable connector system is provided for distributing power between an input power source and a cable harness connector having a first number M of cable harness terminals configured to carry a plurality of different currents. The reconfigurable connector system includes an energy center module and a connecting adapter. The energy center module has a module housing, a printed circuit board located within the module housing and having more than M pin holes therein, a plurality of electronic fuses located within the module housing and operatively connected with the pin holes, a controller located within the module housing and operatively connected with the plurality of electronic fuses via control circuitry, and an input connector located within the module housing for receiving power from the input power source and operatively connected to one or more of the controller and the plurality of electronic fuses via power circuitry, wherein the controller is configured for running control software for controlling the plurality of electronic fuses. The connecting adapter has an electrically insulative body with opposed first and second sides and M electrically conductive bridging adapters within the body. Each bridging adapter includes: a respective first connection point accessible from the first side of the body and configured to be directly connectable with a respective one of the cable harness terminals; one or more respective second connection points accessible from the second side of the body and configured to be directly or indirectly connectable with a respective one or more of the pin holes; and a respective busbar connecting the respective first connection point with the one or more respective second connection points. In this embodiment, the printed circuit board includes an array of pin connectors, wherein each pin connector has a respective first pin end inserted into a respective one of the pin holes and having a male polarity and a second pin end extending outward from the printed circuit board and having a male or female polarity.

Each of the first connection points may be a male terminal, each of the second connection points may be a terminal having a polarity opposite the polarity of the second pin ends, each of the cable harness terminals may be a female terminal, each of the second connection points may be configured for direct connection with a respective one of the second pin ends, and the connecting adapter may be configured for engagement with the module housing for effecting press-fit connection of the second connection points with the second pin ends.

The reconfigurable connector system may further include the cable harness connector, wherein each of the first connection points is a male terminal, each of the second connection points is a terminal having a polarity opposite the polarity of the second pin ends, each of the cable harness terminals is a female terminal, each of the second connection points is configured for direct connection with a respective one of the second pin ends, and the connecting adapter is configured for being secured at least partially within the cable harness connector and for engagement with the module housing for effecting press-fit connection of the second connection points with the second pin ends.

Alternatively, the reconfigurable connector system may further include the cable harness connector and a respective wire for each bridging adapter, wherein each of the first connection points is a terminal configured for direct attachment with the respective wire, each of the second connection points is a terminal having a polarity opposite the polarity of the second pin ends, each of the cable harness terminals is a crimp or a soldering, each of the second connection points is configured for direct connection with a respective one of the second pin ends, and the connecting adapter is configured for being secured at least partially within the cable harness connector and for engagement with the module housing for effecting press-fit connection of the second connection points with the second pin ends.

The above features and advantages, and other features and advantages, of the present teachings are readily apparent from the following detailed description of some of the best modes and other embodiments for carrying out the present teachings, as defined in the appended claims, when taken in connection with the accompanying drawings.

DETAILED DESCRIPTION

Figure 1:
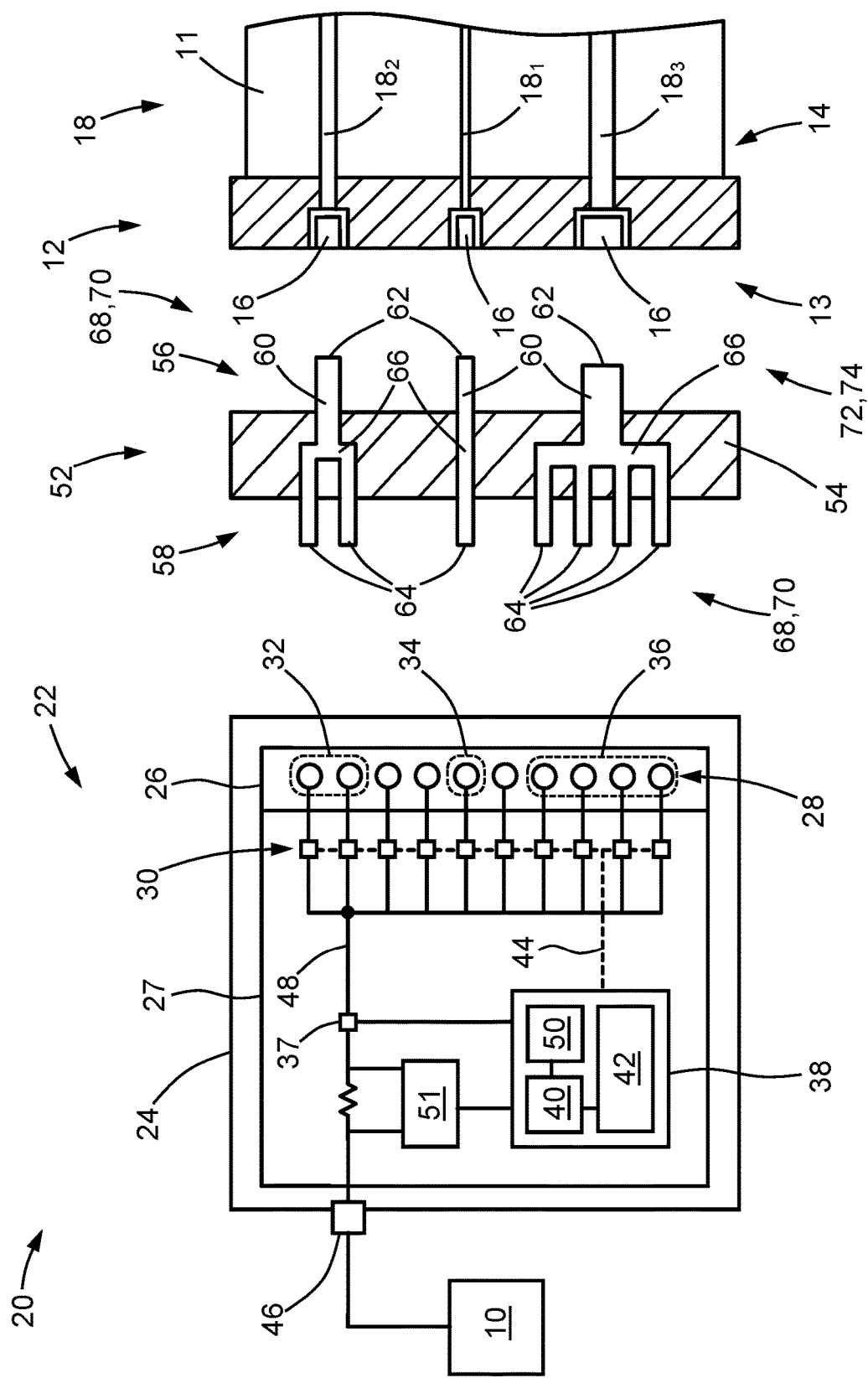
FIG. 1 is a schematic view of a reconfigurable connector system including an energy center module, a connecting adapter and a cable harness connector.

Referring now to the drawings, wherein like numerals indicate like parts in the several views, a reconfigurable connector system 20 for distributing power between an input power source 10 and a cable harness connector 12 is shown and described herein.

The connector system 20 described herein may be viewed as being "reconfigurable" for at least two reasons. First, the reconfigurable connector system 20 utilizes a plurality of electronic fuses (also called "e-fuses") 30 which may be individually programmed and controlled by a controller 38, as described in more detail below. (Optionally, the system 20 of the present disclosure may utilize some portions of U.S. Pat. No. 11,349,475, titled "Systems and Methods for Reallocation of Electronic Fuses Configured to Drive a Fuse Harness Operationally Coupled to Multiple Loads Implemented Onboard a Vehicle", the entirety of which is hereby incorporated herein by reference.) Second, the reconfigurable connector system 20 may utilize various electro-mechanical connectors to provide a variety of different amperages to the wires or cables 18, as described in more detail below. These factors provide a wide range of customization and reconfigurability to the connector system 20.

Figure 2:
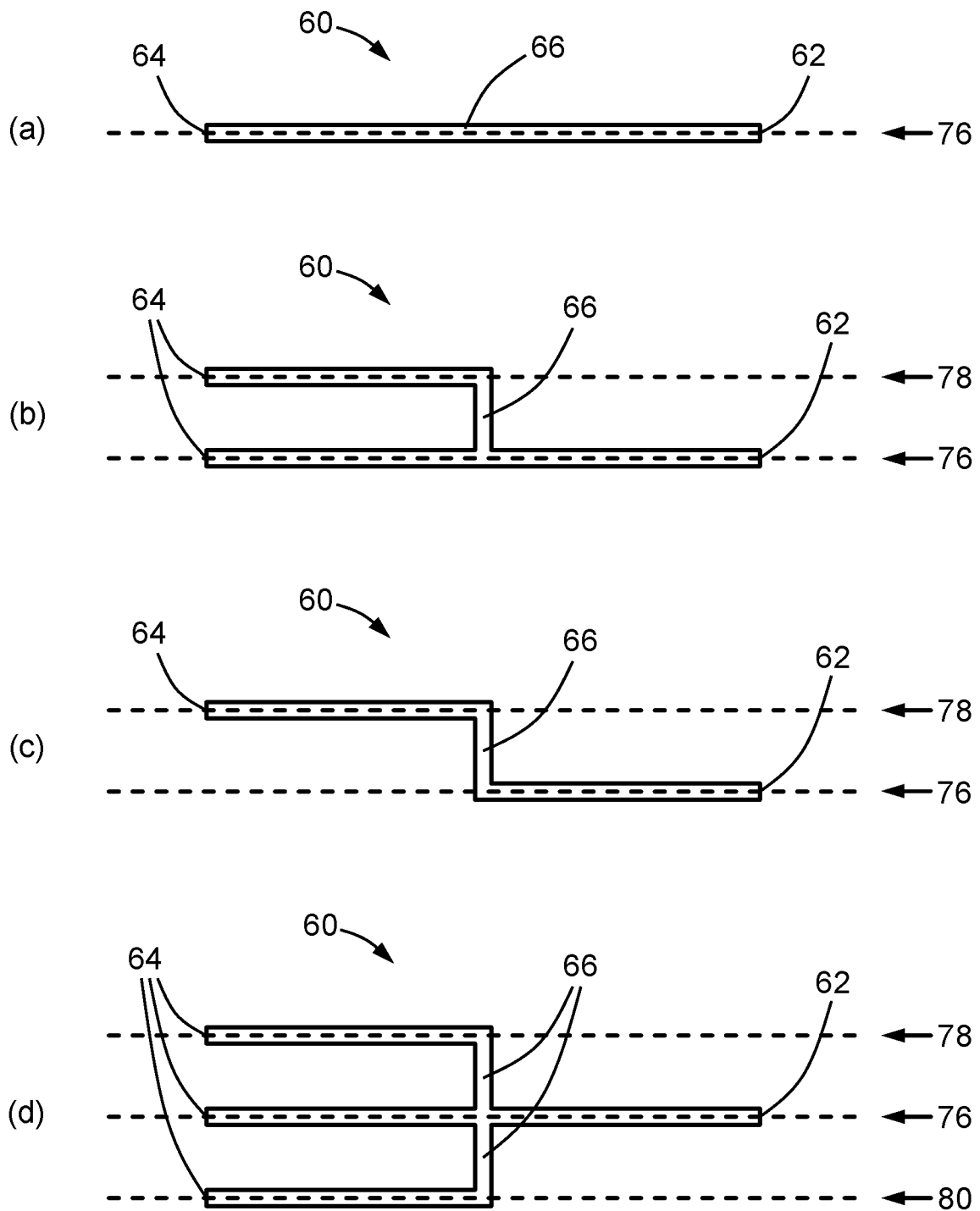
FIG. 2 is a schematic side view of selected bridging adapters.

FIG. 1 shows a generalized schematic view of a reconfigurable connector system 20 which includes an energy center module 22 and a connecting adapter 52 which interfaces with a cable harness connector 12. FIG. 2 shows a schematic side view of selected bridging adapters 60 which may be used in a connecting adapter 52. FIGS. 3-6 show schematic views of the reconfigurable connector system 20 according to a first configuration I, a second configuration II, a third configuration III, a fourth configuration IV and a fifth configuration V.

FIG. 1 shows a reconfigurable connector system 20 according to a generalized embodiment which is applicable to many different configurations. The reconfigurable connector system 20 is provided for distributing power between an input power source 10 and a cable harness connector 12 that is connected or connectable to a cable harness 11 or a bundle of wires or cables 18. In this arrangement, the input power source 10 may be any electrical power source such as a battery, a capacitor, an auxiliary power module (e.g., in an electric/hybrid vehicle application), a generator (e.g., in an internal combustion engine application), a regenerative braking arrangement (e.g., in a hybrid vehicle application) or the like, and he cable harness connector 12 has a first number M of cable harness terminals 16 configured to carry a plurality of different currents. In the example shown in FIG. 1, three individual wires $18_1$, $18_2$, $18_3$ and three cable harness terminals 16 are shown (i.e., M=3), but the cable harness/bundle 11 may include more than just these three wires $18_1$, $18_2$, $18_3$ and the cable harness connector 12 may include more than just the three terminals 16 shown. (Note that as used herein, the reference numeral "18" may be used to refer to any individual wire $18_1$, $18_2$, $18_3$ or to the collective group of individual wires $18_1$, $18_2$, $18_3$.)

In the arrangement shown, the first wire $18_1$ may be a 1.5 A (amp) wire, the second wire $18_2$ may be a 2.8 A wire that is larger and capable of carrying more amperage than the first wire $18_1$, and the third wire $18_3$ may be a 6.3 A wire that is larger and capable of carrying more amperage than the second wire $18_2$. The cable harness terminals 16 that are connected or connectable to these three wires $18_1$, $18_2$, $18_3$ may be appropriately sized, shaped or otherwise configured so as to accommodate the amperage capacity of their associated wires $18_1$, $18_2$, $18_3$.

The reconfigurable connector system 20 may include an energy center module 22 and a connecting adapter 52. The energy center module 22 has a module housing 24 and a printed circuit board ("PCB") 26 located within the module housing 24. The PCB 26 has a plurality of pin holes 28 formed therein, where the plurality is a number more than M. A plurality of e-fuses 30 are located within the module housing 24, with each e-fuse 30 being operatively connected with a respective one of the pin holes 28. The e-fuses 30 may be located on the PCB 26 (i.e., on a main or first PCB 26), or they may be located on a second or auxiliary PCB 27 with appropriate traces or jumpers connecting the e-fuses 30 with their respective pin holes 28. (Note that as used hereinafter, the main or first PCB 26 may optionally include the second or auxiliary PCB 27, or a single PCB 26 may be used instead of two PCBs 26, 27.) The e-fuses 30 may be arranged in clusters or groups, such as the first, second and third clusters 32, 34, 36 shown within respective dashed ovals. Each of these clusters 32, 34, 36 may correspond with a respective set of pin holes 28, a respective cable harness terminal 16 and with a respective bridging adapter 60, as described in more detail below.

A controller 38 (sometimes referred to as a microprocessor control unit or "MCU") is located within the module housing 24 and is operatively connected with the e-fuses 30 via control circuitry 44. For example, the controller 38 may be located on the PCB(s) 26, 27, and the control circuitry 44 may be conductive traces formed on or within the PCB(s) 26, 27. The controller 38 is configured for running control software 50 for controlling the plurality of e-fuses 30. In some configurations, each e-fuse 30 may comprise or act as its own autonomous "internal controller", with the e-fuses 30 interfacing with the controller/MCU 38 on power-up to configure the e-fuses 30. Thus, the "controlling" of the e-fuses 30 may include configuring, assigning or mapping the e-fuses 30 to the aforementioned clusters 32, 34, 36 (and their respective sets of pin holes 28), wherein each cluster 32, 34, 36 corresponds with a respective one of the bridging adapters 60. The controller/MCU 28 may monitor the status of each e-fuse 30 and react as needed if a fault is detected. (For example, in a detected fault condition, the controller/MCU 28 may "override" the "internal controller" of the affected e-fuse 30 and may re-configure, re-assign or re-map one or more of the e-fuses 30.) The controller 38 may include a memory 40 configured for storing the control software 50 and processing circuitry (e.g., a processor) 42 that is configured for retrieving the control software 50 from the memory 40 and executing the control software 50. The memory 40 may include a set of registers, volatile storage media, non-volatile storage media or the like. The control software 50 may comprise instructions or code that is stored in the memory 40 and which is retrievable and executable by the processing circuitry 42. Additionally or alternatively, the control software 50 may comprise a set of values or calibrations stored in the memory 40, which the processing circuitry 42 is configured to retrieve and utilize in order to effectuate a mapping or assignment between the e-fuses 30 and the pin holes 28. Optionally, the reconfigurable connector system 20 may further include the control software 50, as well as an intelligent battery system ("IBS") 51 and a conventional fuse 37 as illustrated.

An input connector 46 is located within the module housing 24 and is configured for receiving power from the input power source 10. The input connector 46 is operatively connected to one or more of the controller 38 and the plurality of e-fuses 30 via power circuitry 48 (e.g., conductive traces formed on or within the PCB(s) 26, 27).

The connecting adapter 52 has an electrically insulative body 54 that has opposed first and second sides 56, 58. As shown in FIG. 1, the first side 56 may be viewed as a cable harness-facing side of the connecting adapter 52, since that side 56 is configured to face and interface with the cable harness 11 and the cable harness connector 12, while the second side 58 may be viewed as a module-facing side of the connecting adapter 52, since that side 58 is configured to face and interface with the module 22. The body 54 of the connecting adapter 52 also has M electrically conductive bridging adapters 60 arranged therein. The bridging adapter 60 may be stamped metal stampings, with each bridging adapter 60 including: (i) a first connection point 62 that is accessible from the first side 56 of the body 54 and is configured to be directly connectable with a respective one of the cable harness terminals 16; (ii) one or more second connection points 64 that are accessible from the second side 58 of the body 54 and are configured to be directly or indirectly connectable with a respective one or more of the pin holes 28; and (iii) a busbar 66 connecting the first connection point 62 with the one or more second connection points 64.

FIG. 1 shows three different configurations of bridging adapters 60—one at the top of the drawing, one at the bottom, and one in the middle. The top configuration has a single first connection point 62 configured as a male terminal 68 having a male polarity 70, two second connection points 64 configured as male terminals 68 having male polarities 70, and a busbar 66 which connects the single first connection point 62 with the two second connection points 64. The bottom configuration has a single first connection point 62 configured as a male terminal 68 having a male polarity 70, four second connection points 64 configured as male terminals 68 having male polarities 70, and a busbar 66 which connects the single first connection point 62 with the four second connection points 64. The middle configuration has a single first connection point 62 configured as a male terminal 68 having a male polarity 70, a single second connection point 64 configured as a male terminal 68 having a male polarity 70, and a busbar 66 which connects the single first connection point 62 with the single second connection point 64. While three different configurations of bridging adapters 60 are illustrated here, each with particular layouts and shapes as shown, it should be understood that other configurations are also possible.

With the first connection points 62 in FIG. 1 all being configured as male terminals 68 having male polarities 70, the cable harness terminals 16 in this drawing are all configured as female terminals 72 having female polarities 74. Also note that the male first connection points 62 and their corresponding female cable harness terminals 16 are sized to accommodate the amount of current-carrying capacity required by the corresponding first wire $18_1$ (1.5 A), second wire $18_2$ (2.8 A) and third wire $18_3$ (6.3 A). However, as indicated by the various configurations discussed below, the first connection points 62 and cable harness terminals 16 may have different arrangements of male and female terminals 68, 72 and polarities 70, 74 than the arrangement shown in FIG. 1.

The M bridging adapters 60 collectively may include M first connection points 62 and a second number N of the second connection points 64, wherein N≥M. For example, as illustrated in FIG. 1, the three bridging adapters 60 collectively have three first connection points 62 (i.e., M=3) and seven second connection points 64 (i.e., N=7), wherein N≥M. In other words, for any given configuration according to the present disclosure, there will be the same number or more of second connection points 64 than there are first connection points 62. This is so that two or more of the pin holes 28 may be combined or ganged together using multiple second connection points 64. For example, if each pin hole 28 is configured to carry up to 1.5 A of current, then two second connection points 64 plugged into two pin holes 28 can carry up to 3.0 A, three second connection points 64 plugged into three pin holes 28 can carry up to 4.5 A, four second connection points 64 plugged into four pin holes 28 can carry up to 6.0 A, and so forth.

FIG. 2 shows a schematic side view of selected bridging adapters 60. For example, at section "(a)", an individual bridging adapter 60 is shown in the form of a flat metal stamping. Here, the first connection point 62, the one or more second connection points 64 and the busbar 66 are all disposed within a first plane 76 (i.e., all within the same plane as each other). At section "(b)", another individual bridging adapter 60 is shown in the form of a metal stamping that has been bent or formed into a first bi-planar arrangement, with the first connection point 62 disposed within a first plane 76, at least one of the second connection points 64 disposed within the first plane 76, and at least one of the second connection points 64 disposed within a second plane 78 that is different from the first plane 76. (This second plane 78 may be parallel with the first plane 76.) At section "(c)", yet another individual bridging adapter 60 is shown in the form of a metal stamping that has been bent or formed into a second bi-planar arrangement, with the first connection point 62 disposed within a first plane 76 and all of the second connection points 64 disposed within a second plane 78 that is different from the first plane 76. And at section "(d)", still another individual bridging adapter 60 is shown in the form of a metal stamping that has been bent or formed into a tri-planar arrangement, with the first connection point 62 disposed within a first plane 76, at least one of the second connection points 64 disposed within the first plane 76, at least one of the second connection points 64 disposed within a second plane 78 that is different from the first plane 76, and at least one of the second connection points 64 disposed within a third plane 80 that is different from the first and second planes 76, 78. (This third plane 80 may be parallel with the first and second planes 76, 78.) Other configurations for the bridging adapter 60 besides these are also possible. For configurations involving more than one plane, such as illustrated in sections "(b)", "(c)" and "(d)", at least some portion of the busbar 66 may extend between or among the planes 76, 78, 80.

In configurations where the second connection points 64 are provided on two or more planes, the pin holes 28 may be provided or arranged so as to match the spacing between the planes. For example, as illustrated in FIG. 1, the PCB 26 may be laid out along a single flat plane, and the second connection points 62 may be inserted into the pin holes 28 at a 90-degree angle to the PCB 26. Alternatively, the portion of the PCB 26 carrying the pin holes 28 may be bent or curved at a 90-degree angle away from the rest of the PCB 26, and the second connection points 62 may be inserted into the pin holes 28 in a direction that is perpendicular to the pin hole-carrying part of the PCB 26 and parallel to the rest of the PCB 26.

The cable harness connector 12 may have a module-facing side 13 that is configured to face toward the energy center module 22 when the cable harness connector 12 is connected with the connecting adapter 52, and a cable harness-facing side 14 that is opposed to the module-facing side 13 and is configured for connecting with the cable harness 11. The cable harness connector 12 may be configured such that each of the cable harness terminals 16 is accessible to the first connection points 62 from the module-facing side 13, with each of the cable harness terminals 16 being configured for connection with a respective wire 18 from the cable harness-facing side 14. In some configurations, the cable harness connector 12 may include the multiple wires or cables 18; however, in other configurations, the cable harness connector 12 is a separate item from the multiple wires or cable 18, but in this configuration the cable harness connector 12 and its cable harness terminals 16 are configured for being connected with the wires and cables 18.

The reconfigurable connector system 20 that is shown in a generalized manner in FIG. 1 may be configured in a number of different configurations, as illustrated in FIGS. 3-6.

Figure 3:
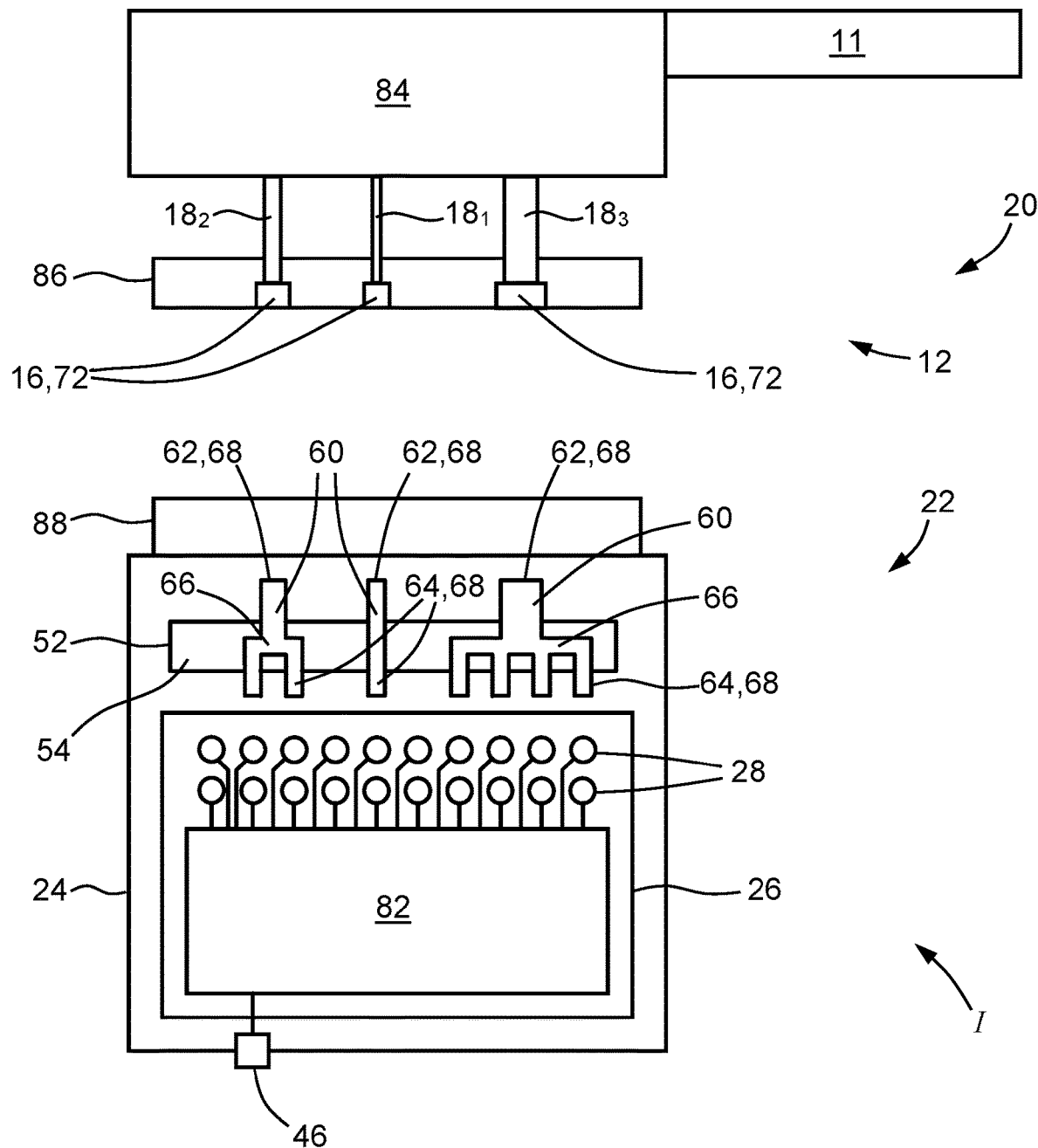
FIG. 3 is a schematic plan view of a reconfigurable connector system according to a first configuration.
Figure 4:
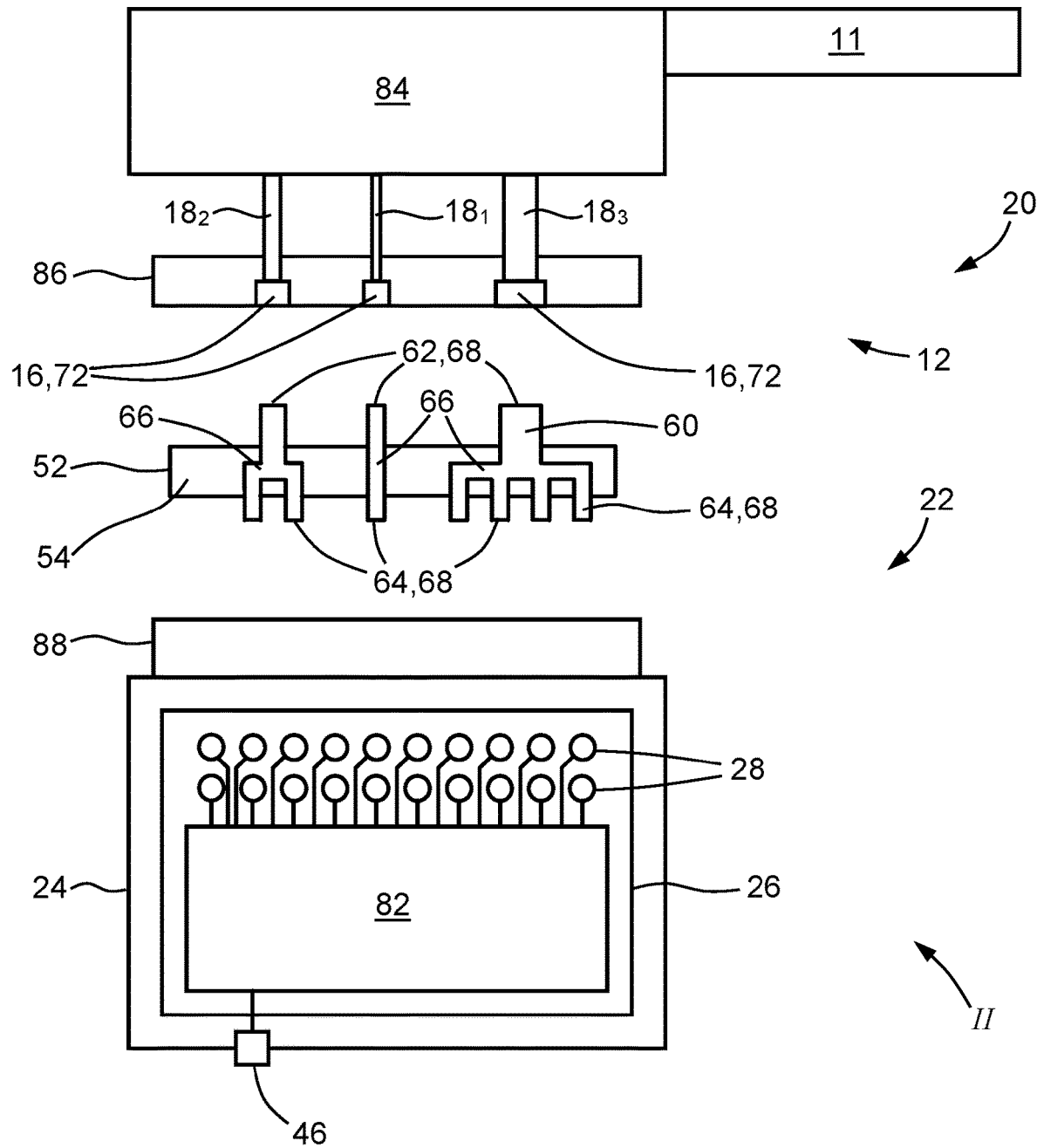
FIG. 4 is a schematic plan view of a reconfigurable connector system according to a second configuration.
Figure 5:
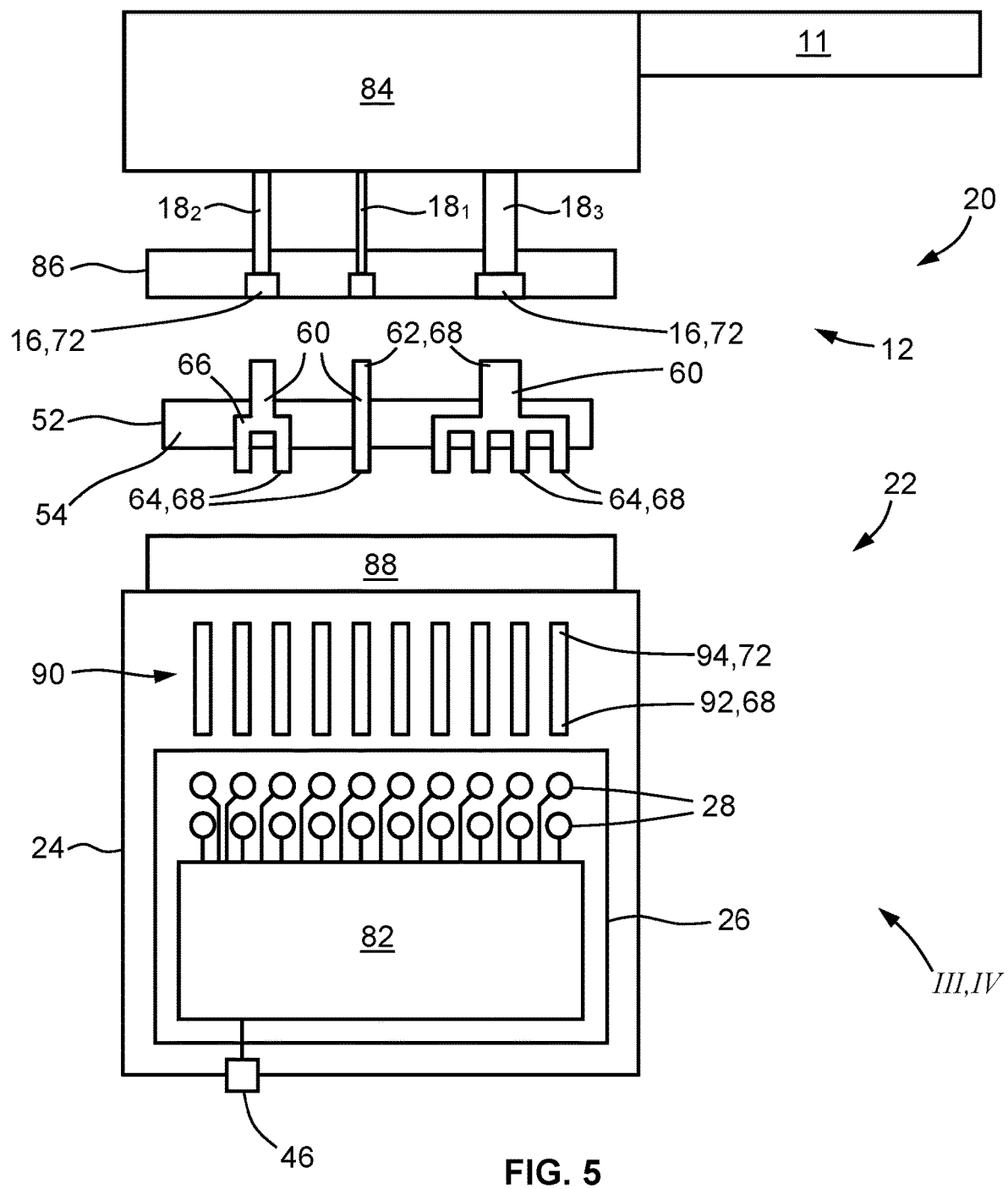
FIG. 5 is a schematic plan view of a reconfigurable connector system according to either or both of a third configuration and a fourth configuration.
Figure 6:
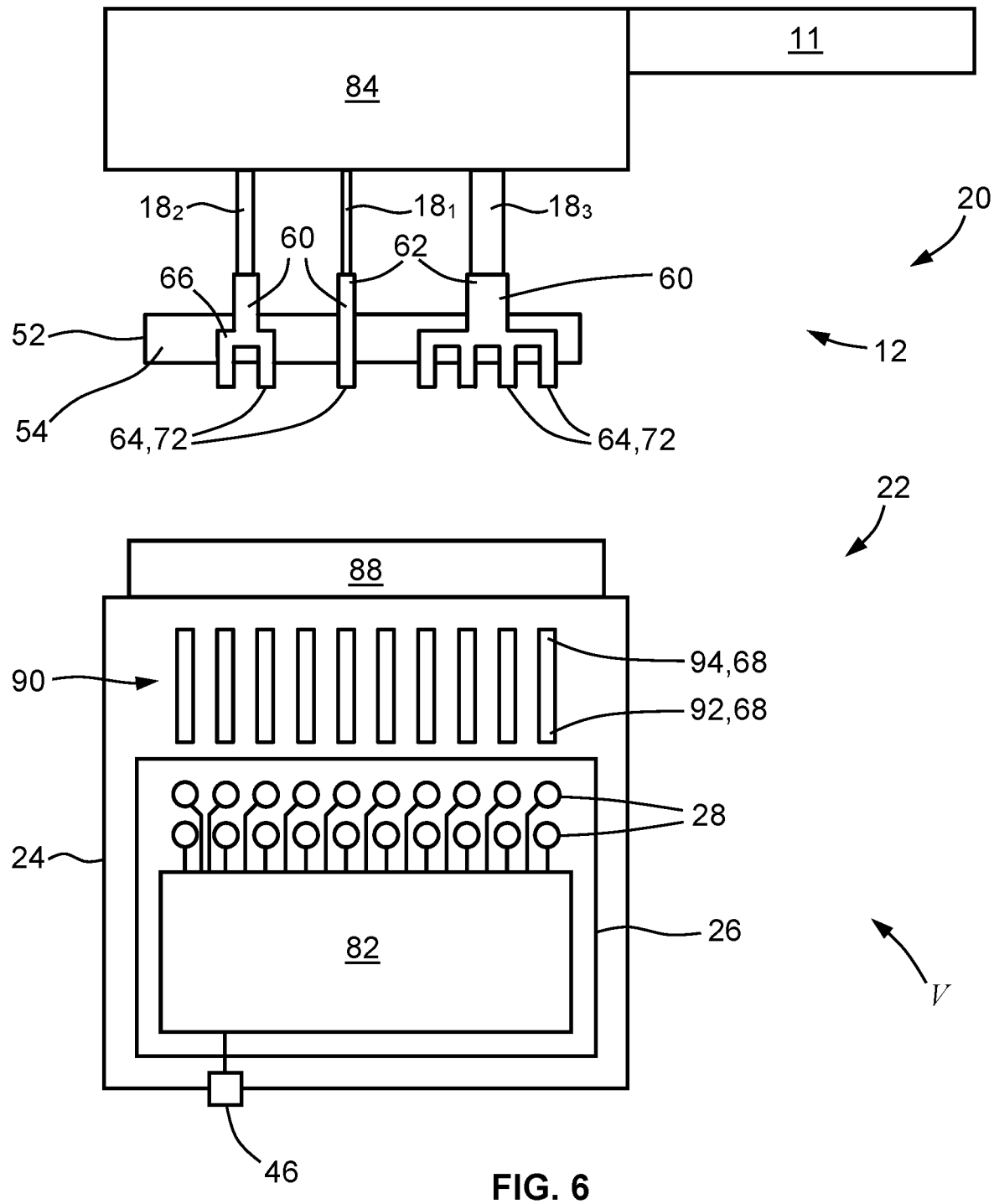
FIG. 6 is a schematic plan view of a reconfigurable connector system according to a fifth configuration.

FIG. 3 shows a schematic plan view of the reconfigurable connector system 20 according to a first configuration I. In this configuration I (as well as in the other configurations II-V as discussed below and as illustrated in FIGS. 4-6), selected portions of the energy center module 22 are shown, such as the module housing 24, the input connector 46, the PCB 26 and the pin holes 28, while other portions of the energy center module 22 which may be disposed on the PCB 26 (e.g., the e-fuses 30, controller 38, etc.) are represented by the rectangle identified by reference numeral 82. The drawing also shows a cable harness connector housing 84 (into which the cable bundle 11 is fed), a cable harness terminal block 86 (for housing the cable harness terminals 16 and serving as a cable harness connector 12), and a mating interface 88 on the module housing 24 (for interfacing with the cable harness terminal block 86/cable harness connector 12). The mating interface 88 may be a part of the module housing 24 or it may be a separate element that is connected to the module housing 24.

In this first configuration I, each of the first and second connection points 62, 64 may be a male terminal 68, each of the cable harness terminals 16 may be a female terminal 72, each of the second connection points 64 may be configured for direct connection with a respective one of the pin holes 28 (e.g., by insertion into the pin holes 28 and/or by being soldered to the pin holes 28), and the connecting adapter 52 may be configured for being secured or fastened at least partially within the module housing 24. In this configuration I, the connecting adapter 52 may be interfaced with the PCB 26 (by insertion/soldering of the second connection points 64 with the pin holes 28) before installing and securing the PCB/connecting adapter assembly 26, 52 into the module housing 24. Then, the cable harness terminal block 86 may interface with the mating interface 88 so that the first connection points 62 may connect with their respective cable harness terminals 16.

FIG. 4 shows a schematic plan view of the reconfigurable connector system 20 according to a second configuration II. In this configuration II, each of the first and second connection points 62, 64 may be a male terminal 68, each of the cable harness terminals 16 may be a female terminal 72, each of the second connection points 64 may be configured for direct connection with a respective one of the pin holes 28, and the connecting adapter 52 may be configured for engagement with the module housing 24 for effecting or facilitating insertion of the second connection points 64 into the pin holes 28. In this second configuration II, the connecting adapter 52 may be interfaced with the PCB 26 (e.g., by insertion of the second connection points 64 with the pin holes 28) after installing and securing the PCB 26 into the module housing 24. The mating interface 88 may be configured to accept insertion and pass-through of the second connection points 64 so that the second connection points 64 may interface with their respective pin holes 28 on the PCB 26. The mating interface 88 may also optionally interface with the body 54 of the connecting adapter 52 to help hold the body 54 in place upon insertion of the second connection points 64 into the pin holes 28.

In FIGS. 5-6, which illustrate the third, fourth and fifth configurations III, IV, V, the PCB 26 may further include an array of pin connectors 90. The array may include a plastic holder which holds all the individual pin connectors 90 together as a unitary package, or the array may include a collection of individual pin connectors 90 without a holder. Each pin connector 90 has a respective first pin end 92 and a respective second pin end 94. Each first pin end 92 may have a male polarity 70 and may be inserted into a respective one of the pin holes 28. With the first pin ends 92 inserted into their respective pin holes 28, each second pin end 94 extends outward from the PCB 26 surface, with each second pin end 94 having either a male polarity 70 or a female polarity 74.

FIG. 5 shows a schematic plan view of the reconfigurable connector system 20 according to the third configuration III. In this configuration III, each of the first connection points 62 may be a male terminal 68, each of the second connection points 64 may be a terminal having a polarity opposite the polarity of the second pin ends 94, each of the cable harness terminals 16 may be a female terminal 72, each of the second connection points 64 may be configured for direct connection with a respective one of the second pin ends 94, and the connecting adapter 52 may be configured for engagement with the module housing 24 for effecting press-fit connection of the second connection points 64 with the second pin ends 94. For example, as illustrated in FIG. 5, the second pin ends 94 may be female terminals 72, and therefore the mating second connection points 64 of the bridging adapters 60 would be male terminals 68. Alternatively, if the second pin ends 94 are male terminals 68, then the mating second connection points 64 would be female terminals 72.

In this third configuration III, the mating interface 88 may be configured to accept insertion and pass-through of the second connection points 64 so that the second connection points 64 may interface with their respective second pin ends 94. The mating interface 88 may also optionally interface with the body 54 of the connecting adapter 52 to help hold the body 54 in place upon insertion of the second connection points 64 into the second pin ends 94. In this configuration III, the connecting adapter 52 may be interfaced with the PCB 26 (via the pin connectors 90) after installing and securing the PCB 26 into the module housing 24.

FIG. 5 also shows a schematic plan view of the reconfigurable connector system 20 according to the fourth configuration IV. In this configuration IV, the reconfigurable connector system 20 may further include the cable harness connector 12, wherein each of the first connection points 62 is a male terminal 68, each of the second connection points 64 is a terminal having a polarity opposite the polarity of the second pin ends 94, each of the cable harness terminals 16 is a female terminal 72, each of the second connection points 64 is configured for direct connection with a respective one of the second pin ends 94, and the connecting adapter 52 is configured for being secured or fastened at least partially within the cable harness connector 12 and for engagement with the module housing 24 for effecting press-fit connection of the second connection points 64 with the second pin ends 94. For example, as illustrated in FIG. 5, the second pin ends 94 may be female terminals 72, and therefore the mating second connection points 64 of the bridging adapters 60 would be male terminals 68. Alternatively, if the second pin ends 94 are male terminals 68, then the mating second connection points 64 would be female terminals 72. In this fourth configuration IV, the first connection points 62 of the connecting adapter 52 may be interfaced with the cable harness terminals 16 in the cable harness terminal block 86, then the connecting adapter/cable harness terminal block assembly 52, 86 may be pushed into the cable harness connector housing 84 and secured or fastened therein.

FIG. 6 shows a schematic plan view of the reconfigurable connector system 20 according to the fifth configuration V. In this configuration V, the reconfigurable connector system 20 may further include the cable harness connector 12 and a respective wire 18 for each bridging adapter 60, wherein each of the first connection points 62 is a terminal configured for direct attachment with the respective wire 18, each of the second connection points 64 is a terminal having a polarity opposite the polarity of the second pin ends 94, each of the cable harness terminals 16 is a crimp or a soldering, each of the second connection points 64 is configured for direct connection with a respective one of the second pin ends 94, and the connecting adapter 52 is configured for being secured at least partially within the cable harness connector 12 and for engagement with the module housing 24 for effecting press-fit connection of the second connection points 64 with the second pin ends 94.

For example, as illustrated in FIG. 6, the second pin ends 94 may be male terminals 68, and therefore the mating second connection points 64 of the bridging adapters 60 would be female terminals 72. Alternatively, if the second pin ends 94 are female terminals 72, then the mating second connection points 64 would be male terminals 68. In this configuration V, there is no need for a cable harness terminal block 86 that is separate from the connecting adapter 52, so the connecting adapter 52 may serve the purpose of the cable harness terminal block 86. Once the wires $18_1$, $18_2$, $18_3$ are crimped, soldered or otherwise connected with their respective first connection points 62, the connecting adapter 52 and the attached wires 18 may be pushed into the cable harness connector housing 84 and secured or fastened therein.

According to another embodiment, which may relate to one or both of the first and second configurations I, II as shown in FIGS. 3-4, a reconfigurable connector system 20 is provided for distributing power between an input power source 10 and a cable harness connector 12 having a first number M of cable harness terminals 16 configured to carry a plurality of different currents. In this embodiment, the reconfigurable connector system 20 includes: (i) an energy center module 22 having a module housing 24, a PCB 26 located within the module housing 24 and having more than M pin holes 28 therein, a plurality of e-fuses 30 located within the module housing 24 and operatively connected with the pin holes 28, a controller 38 located within the module housing 24 and operatively connected with the plurality of e-fuses 30 via control circuitry 44, and an input connector 46 located within the module housing 24 for receiving power from the input power source 10 and operatively connected to one or more of the controller 38 and the plurality of e-fuses 30 via power circuitry 48, wherein the controller 38 is configured for running control software 50 for controlling the plurality of e-fuses 30; (ii) and a connecting adapter 52 having an electrically insulative body 54 with opposed first and second sides 56, 58 and M electrically conductive bridging adapters 60 within the body 54. Each bridging adapter 60 includes: (a) a respective first connection point 62 accessible from the first side 56 of the body 54 and configured to be directly connectable with a respective one of the cable harness terminals 16; (b) one or more respective second connection points 64 accessible from the second side 58 of the body 54 and configured to be directly or indirectly connectable with a respective one or more of the pin holes 28; and (c) a respective busbar 66 connecting the respective first connection point 62 with the one or more respective second connection points 64. In this embodiment, each of the first and second connection points 62, 64 is a male terminal 68, each of the cable harness terminals 16 is a female terminal 72, each of the second connection points 64 is configured for direct connection with a respective one of the pin holes 28, and the connecting adapter 52 is configured for being secured at least partially within the module housing 24 or for engagement with the module housing 24 for effecting insertion of the second connection points 64 into the pin holes 28.

According to yet another embodiment, which may relate to one or more of the third, fourth and fifth configurations III, IV, V as shown in FIGS. 5-6, a reconfigurable connector system 20 is provided for distributing power between an input power source 10 and a cable harness connector 12 having a first number M of cable harness terminals 16 configured to carry a plurality of different currents. The reconfigurable connector system 20 includes an energy center module 22 and a connecting adapter 52. The energy center module 22 has a module housing 24, a PCB 26 located within the module housing 24 and having more than M pin holes 28 therein, a plurality of e-fuses 30 located within the module housing 24 and operatively connected with the pin holes 28, a controller 38 located within the module housing 24 and operatively connected with the plurality of e-fuses 30 via control circuitry 44, and an input connector 46 located within the module housing 24 for receiving power from the input power source 10 and operatively connected to one or more of the controller 38 and the plurality of e-fuses 30 via power circuitry 48, wherein the controller 38 is configured for running control software 50 for controlling the plurality of e-fuses 30. The connecting adapter 52 has an electrically insulative body 54 with opposed first and second sides 56, 58 and M electrically conductive bridging adapters 60 within the body 54. Each bridging adapter 60 includes: a respective first connection point 62 accessible from the first side 56 of the body 54 and configured to be directly connectable with a respective one of the cable harness terminals 16; one or more respective second connection points 64 accessible from the second side 58 of the body 54 and configured to be directly or indirectly connectable with a respective one or more of the pin holes 28; and a respective busbar 66 connecting the respective first connection point 62 with the one or more respective second connection points 64. In this embodiment, the PCB 26 includes an array of pin connectors 90, wherein each pin connector 90 has a respective first pin end 92 inserted into a respective one of the pin holes 28 and having a male polarity 70 and a second pin end 94 extending outward from the PCB 26 and having a male polarity 70 or a female polarity 74.

In the third configuration III of this yet another embodiment, each of the first connection points 62 may be a male terminal 68, each of the second connection points 64 may be a terminal having a polarity opposite the polarity of the second pin ends 94, each of the cable harness terminals 16 may be a female terminal 72, each of the second connection points 64 may be configured for direct connection with a respective one of the second pin ends 94, and the connecting adapter 52 may be configured for engagement with the module housing 24 for effecting press-fit connection of the second connection points 64 with the second pin ends 94.

In the fourth configuration IV of this yet another embodiment, the reconfigurable connector system 20 may further include the cable harness connector 12, wherein each of the first connection points 62 is a male terminal 68, each of the second connection points 64 is a terminal having a polarity opposite the polarity of the second pin ends 94, each of the cable harness terminals 16 is a female terminal 72, each of the second connection points 64 is configured for direct connection with a respective one of the second pin ends 94, and the connecting adapter 52 is configured for being secured at least partially within the cable harness connector 12 and for engagement with the module housing 24 for effecting press-fit connection of the second connection points 64 with the second pin ends 94.

In the fifth configuration V of this yet another embodiment, the reconfigurable connector system 20 may further include the cable harness connector 12 and a respective wire 18 for each bridging adapter 60, wherein each of the first connection points 62 is a terminal configured for direct attachment with the respective wire 18, each of the second connection points 64 is a terminal having a polarity opposite the polarity of the second pin ends 94, each of the cable harness terminals 16 is a crimp or a soldering, each of the second connection points 64 is configured for direct connection with a respective one of the second pin ends 94, and the connecting adapter 52 is configured for being secured at least partially within the cable harness connector 12 and for engagement with the module housing 24 for effecting press-fit connection of the second connection points 64 with the second pin ends 94.

It may be noted that while various configurations and arrangements have been shown in the drawings and described in this specification, wherein certain connecting elements (e.g., the cable harness terminals 16, the first connection points 62, the second connection points 64 and the second pin ends 94) are shown or described as being male terminals 68 having a male polarity 70 or female terminals 72 having a female polarity 74, other configurations, arrangements and combinations are also possible and within the scope of the present disclosure.

Also note that at some points throughout the present disclosure, reference may be made to a singular input, output, element, etc., while at other points reference may be made to plural/multiple inputs, outputs, elements, etc. Thus, weight should not be given to whether the input(s), output(s), element(s), etc. are used in the singular or plural form at any particular point in the present disclosure, as the singular and plural uses of such words should be viewed as being interchangeable, unless the specific context dictates otherwise.

The above description is intended to be illustrative, and not restrictive. While the dimensions and types of materials described herein are intended to be illustrative, they are by no means limiting and are exemplary embodiments. In the following claims, use of the terms "first", "second", "top", "bottom", etc. are used merely as labels, and are not intended to impose numerical or positional requirements on their objects. As used herein, an element or step recited in the singular and preceded by the word "a" or "an" should be understood as not excluding plural of such elements or steps, unless such exclusion is explicitly stated. Additionally, the phrase "at least one of A and B" and the phrase "A and/or B" should each be understood to mean "only A, only B, or both A and B". Moreover, unless explicitly stated to the contrary, embodiments "comprising" or "having" an element or a plurality of elements having a particular property may include additional such elements not having that property. And when broadly descriptive adverbs such as "substantially" and "generally" are used herein to modify an adjective, these adverbs mean "mostly", "mainly", "for the most part", "to a significant extent", "to a large degree" and/or "at least 51 to 99% out of a possible extent of 100%", and do not necessarily mean "perfectly", "completely", "strictly", "entirely" or "100%". Additionally, the word "proximate" may be used herein to describe the location of an object or portion thereof with respect to another object or portion thereof, and/or to describe the positional relationship of two objects or their respective portions thereof with respect to each other, and may mean "near", "adjacent", "close to", "close by", "at" or the like.

This written description uses examples, including the best mode, to enable those skilled in the art to make and use devices, systems and compositions of matter, and to perform methods, according to this disclosure. It is the following claims, including equivalents, which define the scope of the present disclosure.

What is claimed is:

1. A reconfigurable connector system for distributing power between an input power source and a cable harness connector having a first number M of cable harness terminals configured to carry a plurality of different currents, comprising:
    an energy center module having a module housing, a printed circuit board located within the module housing and having more than M pin holes therein, a plurality of electronic fuses located within the module housing and operatively connected with the pin holes, a controller located within the module housing and operatively connected with the plurality of electronic fuses via control circuitry, and an input connector located within the module housing for receiving power from the input power source and operatively connected to one or more of the controller and the plurality of electronic fuses via power circuitry, wherein the controller is configured for running control software for controlling the plurality of electronic fuses; and
    a connecting adapter having an electrically insulative body with opposed first and second sides and M electrically conductive bridging adapters within the body, wherein each bridging adapter includes:
        a respective first connection point accessible from the first side of the body and configured to be directly connectable with a respective one of the cable harness terminals;
        one or more respective second connection points accessible from the second side of the body and configured to be directly or indirectly connectable with a respective one or more of the pin holes; and
        a respective busbar connecting the respective first connection point with the one or more respective second connection points.

2. The reconfigurable connector system of claim 1, wherein the controller includes a memory configured for storing the control software and processing circuitry configured for retrieving the control software from the memory and executing the control software.

3. The reconfigurable connector system of claim 2, further including the control software.

4. The reconfigurable connector system of claim 1, wherein the controlling of the plurality of electronic fuses includes assigning one or more of the plurality of electronic fuses to one or more clusters of the electronic fuses, wherein each cluster corresponds with a respective one of the bridging adapters.

5. The reconfigurable connector system of claim 1, wherein the plurality of electronic fuses and the controller are located on the printed circuit board.

6. The reconfigurable connector system of claim 1, wherein each electronic fuse is operatively connected with a respective one of the pin holes.

7. The reconfigurable connector system of claim 1, wherein the M bridging adapters collectively include M first connection points and a second number N of the second connection points, wherein N≥M.

8. The reconfigurable connector system of claim 1, wherein the respective first connection point, the respective one or more second connection points and the respective busbar for each bridging adapter are oriented either:
within the same plane as each other; or
with the respective first connection point disposed within a first plane and with at least one of the respective one or more second connection points disposed within a second plane that is different from the first plane.

9. The reconfigurable connector system of claim 1, wherein the cable harness connector has a module-facing side and an opposed cable harness-facing side, wherein each of the cable harness terminals is accessible to the first connection points from the module-facing side and is configured for connection with a respective wire from the cable harness-facing side.

10. The reconfigurable connector system of claim 1, wherein each of the first and second connection points is a male terminal, each of the cable harness terminals is a female terminal, each of the second connection points is configured for direct connection with a respective one of the pin holes, and the connecting adapter is configured for being secured at least partially within the module housing.

11. The reconfigurable connector system of claim 1, wherein each of the first and second connection points is a male terminal, each of the cable harness terminals is a female terminal, each of the second connection points is configured for direct connection with a respective one of the pin holes, and the connecting adapter is configured for engagement with the module housing for effecting insertion of the second connection points into the pin holes.

12. The reconfigurable connector system of claim 1, wherein the printed circuit board includes an array of pin connectors, wherein each pin connector has a respective first pin end inserted into a respective one of the pin holes and having a male polarity and a second pin end extending outward from the printed circuit board and having a male or female polarity.

13. The reconfigurable connector system of claim 12, wherein each of the first connection points is a male terminal, each of the second connection points is a terminal having a polarity opposite the polarity of the second pin ends, each of the cable harness terminals is a female terminal, each of the second connection points is configured for direct connection with a respective one of the second pin ends, and the connecting adapter is configured for engagement with the module housing for effecting press-fit connection of the second connection points with the second pin ends.

14. The reconfigurable connector system of claim 12, further comprising the cable harness connector, wherein each of the first connection points is a male terminal, each of the second connection points is a terminal having a polarity opposite the polarity of the second pin ends, each of the cable harness terminals is a female terminal, each of the second connection points is configured for direct connection with a respective one of the second pin ends, and the connecting adapter is configured for being secured at least partially within the cable harness connector and for engagement with the module housing for effecting press-fit connection of the second connection points with the second pin ends.

15. The reconfigurable connector system of claim 12, further comprising the cable harness connector and a respective wire for each bridging adapter, wherein each of the first connection points is a terminal configured for direct attachment with the respective wire, each of the second connection points is a terminal having a polarity opposite the polarity of the second pin ends, each of the cable harness terminals is a crimp or a soldering, each of the second connection points is configured for direct connection with a respective one of the second pin ends, and the connecting adapter is configured for being secured at least partially within the cable harness connector and for engagement with the module housing for effecting press-fit connection of the second connection points with the second pin ends.

16. A reconfigurable connector system for distributing power between an input power source and a cable harness connector having a first number M of cable harness terminals configured to carry a plurality of different currents, comprising:
an energy center module having a module housing, a printed circuit board located within the module housing and having more than M pin holes therein, a plurality of electronic fuses located within the module housing and operatively connected with the pin holes, a controller located within the module housing and operatively connected with the plurality of electronic fuses via control circuitry, and an input connector located within the module housing for receiving power from the input power source and operatively connected to one or more of the controller and the plurality of electronic fuses via power circuitry, wherein the controller is configured for running control software for controlling the plurality of electronic fuses; and
a connecting adapter having an electrically insulative body with opposed first and second sides and M electrically conductive bridging adapters within the body, wherein each bridging adapter includes:
a respective first connection point accessible from the first side of the body and configured to be directly connectable with a respective one of the cable harness terminals;
one or more respective second connection points accessible from the second side of the body and configured to be directly or indirectly connectable with a respective one or more of the pin holes; and
a respective busbar connecting the respective first connection point with the one or more respective second connection points;
wherein each of the first and second connection points is a male terminal, each of the cable harness terminals is a female terminal, each of the second connection points is configured for direct connection with a respective one of the pin holes, and the connecting adapter is configured for being secured at least partially within the module housing or for engagement with the module housing for effecting insertion of the second connection points into the pin holes.

17. A reconfigurable connector system for distributing power between an input power source and a cable harness connector having a first number M of cable harness terminals configured to carry a plurality of different currents, comprising:
- an energy center module having a module housing, a printed circuit board located within the module housing and having more than M pin holes therein, a plurality of electronic fuses located within the module housing and operatively connected with the pin holes, a controller located within the module housing and operatively connected with the plurality of electronic fuses via control circuitry, and an input connector located within the module housing for receiving power from the input power source and operatively connected to one or more of the controller and the plurality of electronic fuses via power circuitry, wherein the controller is configured for running control software for controlling the plurality of electronic fuses; and
- a connecting adapter having an electrically insulative body with opposed first and second sides and M electrically conductive bridging adapters within the body, wherein each bridging adapter includes:
  - a respective first connection point accessible from the first side of the body and configured to be directly connectable with a respective one of the cable harness terminals;
  - one or more respective second connection points accessible from the second side of the body and configured to be directly or indirectly connectable with a respective one or more of the pin holes; and
  - a respective busbar connecting the respective first connection point with the one or more respective second connection points;
- wherein the printed circuit board includes an array of pin connectors, wherein each pin connector has a respective first pin end inserted into a respective one of the pin holes and having a male polarity and a second pin end extending outward from the printed circuit board and having a male or female polarity.

18. The reconfigurable connector system of claim 17, wherein each of the first connection points is a male terminal, each of the second connection points is a terminal having a polarity opposite the polarity of the second pin ends, each of the cable harness terminals is a female terminal, each of the second connection points is configured for direct connection with a respective one of the second pin ends, and the connecting adapter is configured for engagement with the module housing for effecting press-fit connection of the second connection points with the second pin ends.

19. The reconfigurable connector system of claim 17, further comprising the cable harness connector, wherein each of the first connection points is a male terminal, each of the second connection points is a terminal having a polarity opposite the polarity of the second pin ends, each of the cable harness terminals is a female terminal, each of the second connection points is configured for direct connection with a respective one of the second pin ends, and the connecting adapter is configured for being secured at least partially within the cable harness connector and for engagement with the module housing for effecting press-fit connection of the second connection points with the second pin ends.

20. The reconfigurable connector system of claim 17, further comprising the cable harness connector and a respective wire for each bridging adapter, wherein each of the first connection points is a terminal configured for direct attachment with the respective wire, each of the second connection points is a terminal having a polarity opposite the polarity of the second pin ends, each of the cable harness terminals is a crimp or a soldering, each of the second connection points is configured for direct connection with a respective one of the second pin ends, and the connecting adapter is configured for being secured at least partially within the cable harness connector and for engagement with the module housing for effecting press-fit connection of the second connection points with the second pin ends.

* * * * *